US012500029B2

(12) United States Patent
Kwon et al.

(10) Patent No.: US 12,500,029 B2
(45) Date of Patent: Dec. 16, 2025

(54) TRANSFORMER HAVING REVERSE STRUCTURE, POWER SUPPLY, AND FLAT PANEL DISPLAY DEVICE INCLUDING THE SAME

(71) Applicant: SOLUM CO., LTD., Yongin-si (KR)

(72) Inventors: Chang Yong Kwon, Suwon-si (KR); Dong Kyun Ryu, Seoul (KR); Yun Sic Bang, Uiwang-si (KR)

(73) Assignee: SOLUM CO., LTD., Yongin-si (KR)

( * ) Notice: Subject to any disclaimer, the term of this patent is extended or adjusted under 35 U.S.C. 154(b) by 788 days.

(21) Appl. No.: 17/676,268

(22) Filed: Feb. 21, 2022

(65) Prior Publication Data

US 2022/0277888 A1 Sep. 1, 2022

(30) Foreign Application Priority Data

Feb. 26, 2021 (KR) ........................ 10-2021-0026414

(51) Int. Cl.

| | |
|---|---|
| ***H01F 27/29*** | (2006.01) |
| ***H01F 27/24*** | (2006.01) |
| ***H01F 27/30*** | (2006.01) |
| ***H01F 27/32*** | (2006.01) |
| ***H05K 5/00*** | (2025.01) |
| ***H05K 5/03*** | (2006.01) |

(52) U.S. Cl.

CPC ........... *H01F 27/292* (2013.01); *H01F 27/24* (2013.01); *H01F 27/306* (2013.01); *H01F 27/325* (2013.01); *H05K 5/0017* (2013.01); *H05K 5/03* (2013.01)

(58) Field of Classification Search

CPC ...... H01F 27/292; H01F 27/24; H01F 27/306; H01F 27/325; H05K 5/0017; H05K 5/03

USPC .......................................................... 361/807

See application file for complete search history.

(56) References Cited

U.S. PATENT DOCUMENTS

2003/0030531 A1* 2/2003 Okano ................ H01F 27/2828 336/198
2009/0309686 A1* 12/2009 Espino .................... H01F 27/06 336/182

(Continued)

FOREIGN PATENT DOCUMENTS

JP H6-112058 A 4/1994
KR 10-1124147 B1 3/2012

(Continued)

OTHER PUBLICATIONS

European Search Report issued for corresponding EP Application No. 22158391.7, dated Aug. 17, 2022.

*Primary Examiner* — Malcolm Barnes

(74) *Attorney, Agent, or Firm* — Renner, Otto, Boisselle & Sklar, LLP

(57) ABSTRACT

A transformer having a reverse structure includes: a bobbin part including an inner bobbin and an outer bobbin including, respectively, body parts having through-holes formed therein and having a tubular shape and flange portions protruding outwardly from both ends of the body parts; coils respectively wound in the inner bobbin and the outer bobbin; and a core electrically coupled to the coils to form a magnetic circuit, wherein the inner bobbin and the outer bobbin include, respectively, external connection terminals fastened to one ends of the flange portions formed at an upper end of the body part and bent in a downward direction.

19 Claims, 5 Drawing Sheets

(56) References Cited

U.S. PATENT DOCUMENTS

| | | | | |
|---|---|---|---|---|
| 2012/0001886 A1* | 1/2012 | Cheon | H05B 41/02 | 336/221 |
| 2012/0002387 A1* | 1/2012 | Park | H05B 41/02 | 361/679.01 |
| 2012/0154089 A1* | 6/2012 | Eom | H01F 27/30 | 336/210 |
| 2012/0154363 A1* | 6/2012 | Kim | H01F 27/325 | 333/185 |

FOREIGN PATENT DOCUMENTS

| | | |
|---|---|---|
| KR | 10-1779071 B1 | 9/2017 |
| KR | 10-2132848 B1 | 7/2020 |

* cited by examiner

TRANSFORMER HAVING REVERSE STRUCTURE, POWER SUPPLY, AND FLAT PANEL DISPLAY DEVICE INCLUDING THE SAME

CROSS-REFERENCE TO RELATED APPLICATION(S)

This application claims benefit of priority to Korean Patent Application No. 10-2021-0026414 filed on Feb. 26, 2021 in the Korean Intellectual Property Office, the disclosure of which is incorporated herein by reference in its entirety.

BACKGROUND

1. Field

The present disclosure relates to a transformer having a reverse structure, a power supply, and a flat panel display device including the same.

2. Description of Related Art

Recently, in the display industry, instead of a cathode ray tube (CRT), a flat panel display (FPD) using new technologies suitable for a multimedia system, such as high resolution and a large screen, has been prominent.

In particular, in large displays, thin displays such as liquid crystal display (LCD) televisions (TVs) and plasma display panel (PDP) TVs have been prominent, and are expected to continuously receive attention in the future in terms of price and marketability.

In the LCT TV thereamong, a cold cathode fluorescent lamp (CCFL) has been used as a backlight light source, but recently, the adoption of alight emitting diode (LED) has been gradually used due to various advantages thereof, such as power consumption, a lifespan and eco-friendliness.

As the LED is used, a backlight unit has been miniaturized, and accordingly, a thickness of a flat-screen TV has also been decreased. In addition, an internal power supply module of the flat-screen TV has also been required to become slim.

In a transformer according to the related art, an external connection terminal has a structure fastened to one end of a lower flange portion formed at a lower end of a body part having a tubular shape and which is bent in a downward direction (hereinafter referred to as a 'normal structure' and a structure in which an external connection terminal is formed at an upper end of the body part having the tubular shape and is bent in the downward direction is referred to as a 'reverse structure'). According to the transformer having such a normal structure, in order to meet a defined height standard of the transformer, a height of the body part around which a coil is wound should be small, and thus, there is a problem that turns may be decreased.

In addition, according to safety standards, a primary terminal to which a primary coil is connected and a secondary winding coil should be spaced apart from each other by a predetermined distance (e.g., 7 mm), which increases a size and a unit cost of a bobbin and increases a defect rate due to damage to the transformer in a manufacturing and transporting process.

RELATED ART DOCUMENT

Patent Document (Patent Document 1) Japanese Patent Application Laid-Open Publication No. 1994-112058 (entitled "Step-up Transformer" published Apr. 22, 1994)

SUMMARY

An aspect of the present disclosure may provide a transformer having a reverse structure capable of increasing turns of a coil while meeting a defined height standard of the transformer and decreasing a thickness of a product, a power supply, and a flat panel display device including the same.

An aspect of the present disclosure may also provide a transformer having a reverse structure capable of securing a distance according to a safety standard between an external connection terminal of an inner bobbin and a coil wound in an outer bobbin through an increase in creepage distance, and thus, decreasing a size and a unit cost of a bobbin and decreasing a defect rate due to damage to the transformer occurring in a manufacturing and transporting process, a power supply, and a flat panel display device including the same.

According to an aspect of the present disclosure, a transformer may include: a bobbin part including an inner bobbin and an outer bobbin including, respectively, body parts having through-holes formed therein and having a tubular shape and flange portions protruding outwardly from both ends of the body parts; coils respectively wound in the inner bobbin and the outer bobbin; and a core electrically coupled to the coils to form a magnetic circuit, wherein the inner bobbin and the outer bobbin include, respectively, external connection terminals fastened to one ends of the flange portions (hereinafter, referred to as upper flange portions) formed at an upper end of the body part and bent in a downward direction.

The inner bobbin and the outer bobbin may be coupled to each other so that the external connection terminal of the inner bobbin and the external connection terminal of the outer bobbin are disposed in opposite directions.

The outer bobbin and the inner bobbin may further include, respectively, terminal fastening parts protruding outwardly from one ends of the upper flange portions and to which the external connection terminals are fastened.

The transformer may further include an insulating cap increasing a creepage distance between the external connection terminal of the inner bobbin and the coil wound in the outer bobbin.

The insulating cap may be configured between the external connection terminal of the inner bobbin and the flange portion of the outer bobbin so that one end of the flange portion of the outer bobbin is inserted thereinto.

The insulating cap may have a rectangular parallelepiped shape of which an inner space is empty, one end of the flange portion of the outer bobbin may be inserted into the inner space through an opened portion of a front surface of the insulating cap, and an area of an upper surface of the insulating cap corresponding to the terminal fastening part may be opened, such that a portion of the flange portion is exposed externally.

At least one fitting projection may be formed on each of both sides of the flange portion of the outer bobbin inserted into the insulating cap, and at least one fitting hole into which the fitting projection is inserted may be formed in positions on both sides of the insulating cap corresponding to the fitting projection.

At least one grip part protruding outwardly in order to facilitate a grip of the insulating cap may be formed on each of both sides of the insulating cap.

An inner surface of the flange portion of the inner bobbin and an inner surface of the flange portion of the outer bobbin may be coplanar with each other.

The outer bobbin may include a coil carry-forward part that is a path by which a lead wire of the coil wound around the body part of the outer bobbin is carried forward to an upper surface of the flange portion of the outer bobbin through an outer peripheral edge of the flange portion of the outer bobbin and is connected to the external connection terminal of the outer bobbin.

The coil carry-forward part may include: a carry-forward groove that is a path in which a lead wire of the coil wound around the body part of the outer bobbin is carried forward to an upper surface of the flange portion of the outer bobbin; and a traversing path that is a path disposed so that the lead wire carried forward through the carry-forward groove traverses the upper surface of the flange portion of the outer bobbin.

The outer bobbin may include a terminal fastening part protruding outwardly from one end of the upper flange portion of the outer bobbin and to which the external connection terminal is fastened, and the coil carry-forward part may be a path formed between the terminal fastening part of the outer bobbin and a guide block protruding from an upper surface of the upper flange portion of the outer bobbin in parallel with the terminal fastening part of the outer bobbin.

The guide block may have one end protruding outwardly from an outer peripheral edge of the upper flange portion of the outer bobbin, and the carry-forward groove may be a groove formed by the protruding one end of the guide block, the terminal fastening part of the outer bobbin, and the upper flange portion of the outer bobbin.

The outer bobbin may further include a bending portion protruding downwardly from one end of a flange portion (hereinafter, referred to as a 'lower flange portion') formed at a lower end of the body part of the outer bobbin and bending a lead wire of the coil wound around the body part of the outer bobbin to connect the lead wire of the coil to the external connection terminal of the outer bobbin.

The inner bobbin may be coupled to the outer bobbin while one end and the other end thereof are supported by the upper flange portion of the outer bobbin through the terminal fastening part provided in the inner bobbin and a wing portion provided in the inner bobbin, respectively.

The outer bobbin may include a guide block protruding from an upper surface of the upper flange portion of the outer bobbin in parallel with the terminal fastening part of the outer bobbin and covering a portion of the through-hole of the outer bobbin, and the wing portion may protrude from an upper surface of the upper flange portion of the inner bobbin in parallel with the guide block so as to be in contact with the guide block and be formed to be spaced apart from one end of the upper flange portion of the inner bobbin by a predetermined distance, such that one end of the upper flange portion of the inner bobbin is inserted into a lower portion of the guide block, and both ends of the wing portion may be formed to be longer than a width of the through-hole of the outer bobbin by a predetermined length so as to be supported by an upper surface of the outer bobbin in a width direction.

According to another aspect of the present disclosure, a transformer may include: a bobbin part including an inner bobbin and an outer bobbin including, respectively, body parts having through-holes formed therein and having a tubular shape and flange portions protruding outwardly from both ends of the body parts; coils respectively wound in the inner bobbin and the outer bobbin; a core electrically coupled to the coils to form a magnetic circuit; and an insulating cap increasing a creepage distance between an external connection terminal of the inner bobbin and the coil wound in the outer bobbin, wherein the insulating cap is configured between the external connection terminal of the inner bobbin and the flange portion of the outer bobbin so that one end of the flange portion of the outer bobbin is inserted thereinto.

According to another aspect of the present disclosure, a power supply may include: a board in which an accommodation part is formed; and a transformer mounted in the accommodation part formed in the board and including a bobbin part including a body part having a through-hole formed therein and having a tubular shape and flange portions protruding outwardly from both ends of the body part, wherein an upper surface of a lower flange portion of the flange portion is coplanar with an upper surface of the board or is positioned on a level below the upper surface of the board.

An external connection terminal bent in a downward direction may be fastened to one end of an upper flange portion of the flange portion.

According to another aspect of the present disclosure, a flat panel display device may include: the power supply as described above; a display panel receiving power from the power supply; and a cover protecting the display panel and the power supply, wherein the power supply is connected to one surface of the display panel in parallel with one surface of the display panel.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
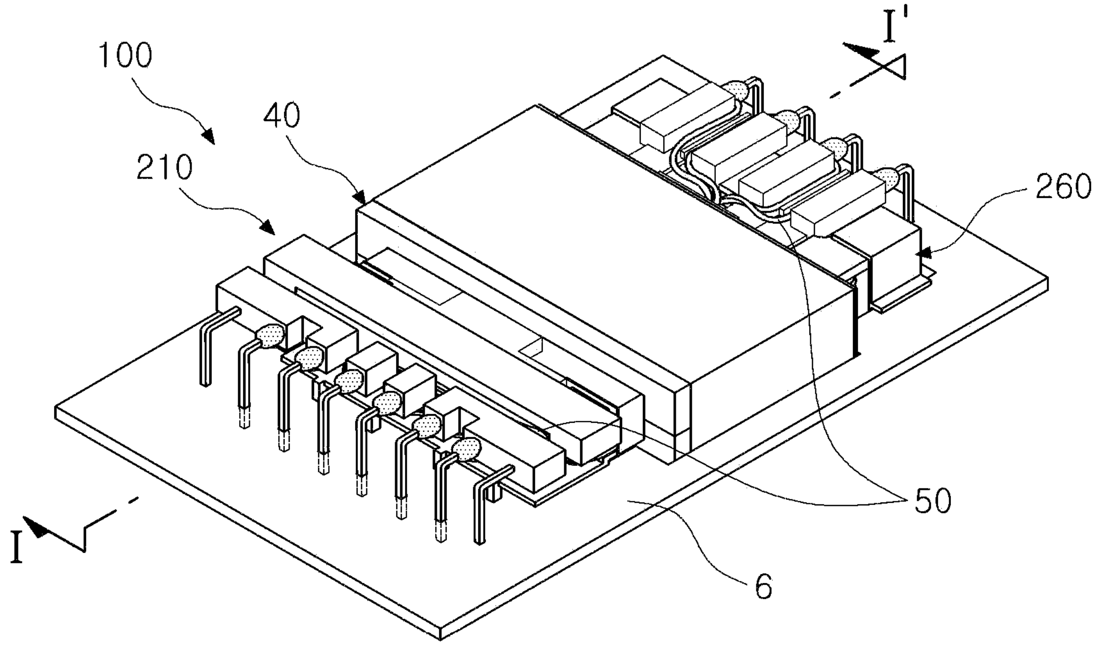
FIG. 1 is a schematic perspective view illustrating a transformer according to an exemplary embodiment of the present disclosure.
Figure 2:
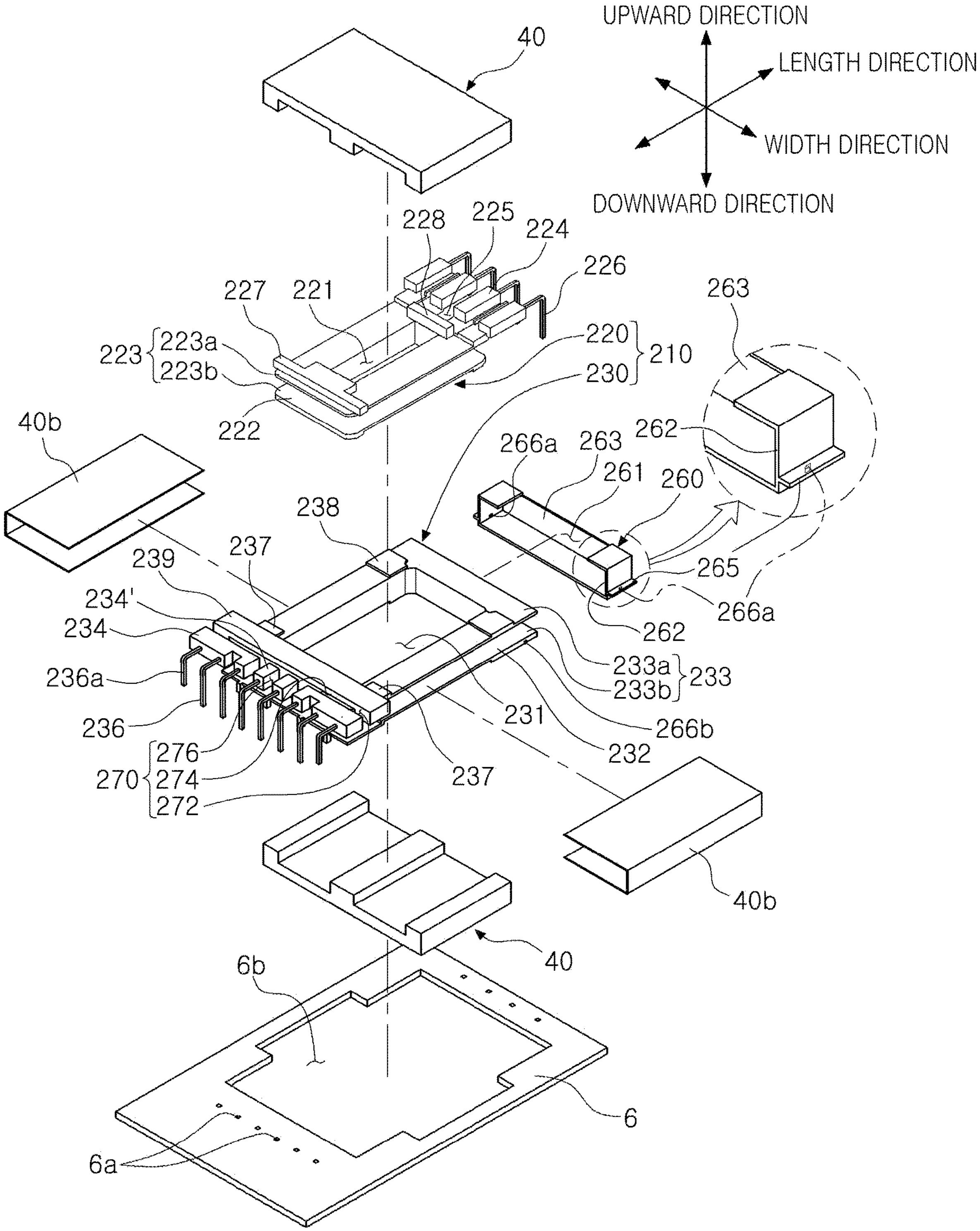
FIG. 2 is an exploded perspective view of the transformer illustrated in FIG. 1.
Figure 3:
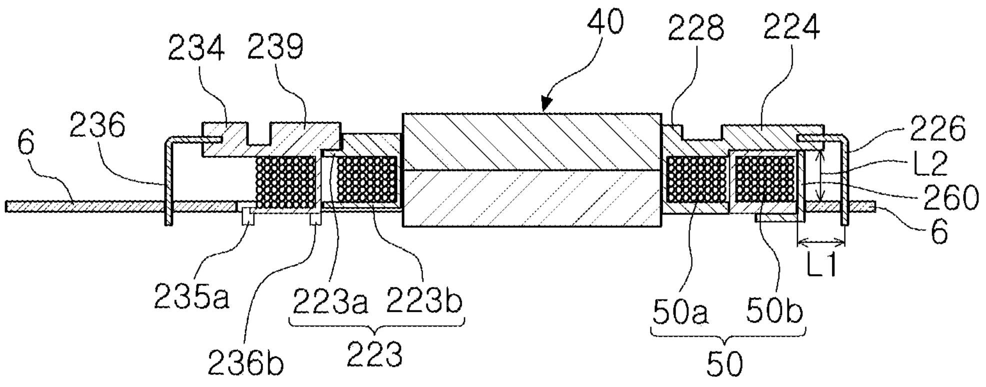
FIG. 3 is a cross-sectional view taken along line I-I' of FIG. 1.

FIG. 1 is a schematic perspective view illustrating a transformer according to an exemplary embodiment of the present disclosure, FIG. 2 is an exploded perspective view of the transformer illustrated in FIG. 1, and FIG. 3 is a cross-sectional view taken along line I-I' of FIG. 1.

Figure 4:
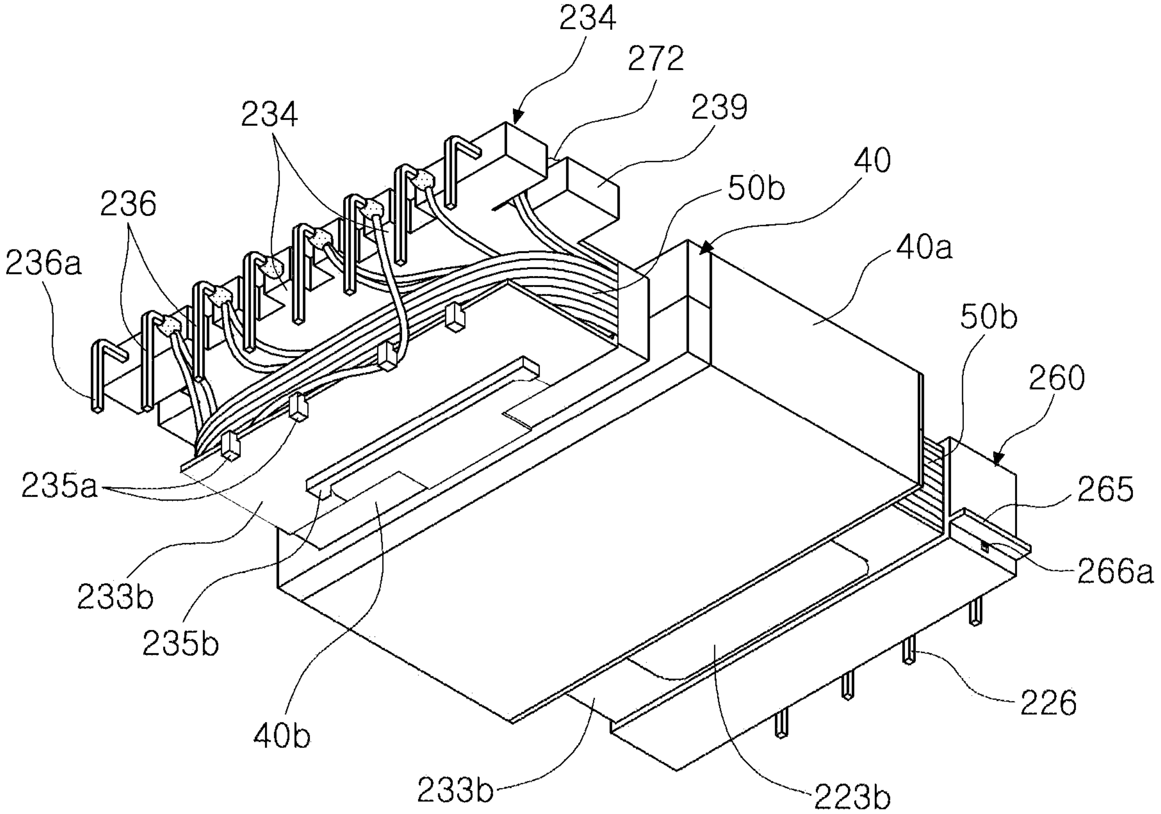
FIG. 4 is a perspective view illustrating a bottom surface of the transformer illustrated in FIG. 1.
Figure 5:
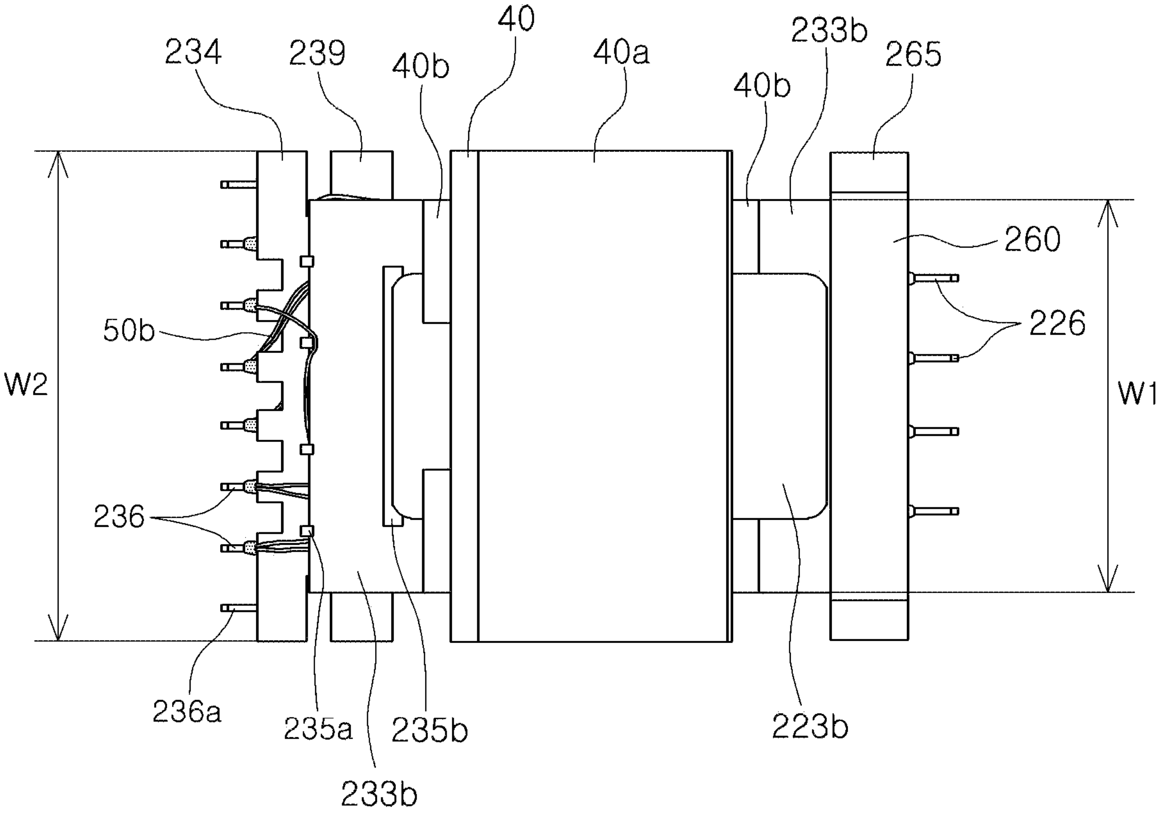
FIG. 5 is a bottom view of the transformer illustrated in FIG. 1.

In addition, FIG. 4 is a perspective view illustrating a bottom surface of the transformer illustrated in FIG. 1, and FIG. 5 is a bottom view of the transformer illustrated in FIG. 1.

Referring to FIGS. 1 to 5, a transformer 100 according to the present exemplary embodiment may include a bobbin part 210, cores 40, and a coil 50.

First, the bobbin part 210 may include an inner bobbin 220 and an outer bobbin 230.

The inner bobbin 220 may include a body part 222 having a through-hole 221 formed at the center of an inner portion thereof and having a tubular shape, a flange portion 223 extending from both ends of the body part 221 in an outer diameter direction of the body part 222, external connection terminals 226 for being electrically and physically connected to the outside, and a terminal fastening part 224 to which the external connection terminals 226 are fastened.

The through-hole 221 formed in the body part 222 may be used as a passage through which portions of cores 40 to be described later are inserted. A case where a cross section of the through-hole 221 is formed in a rectangular shape is described by way of example in the present exemplary embodiment. Such a cross section of the through-hole 221 may be formed according to a shape of the core 40 inserted into the through-hole 221, and the inner bobbin 220 according to the present disclosure is not limited thereto, and the through-hole 221 may be formed in various shapes corresponding to a shape of the core 40 inserted into the through-hole 221.

The flange portion 223 may be divided into an upper flange portion 223*a* and a lower flange portion 223*b* according to formation positions. In addition, a space between an outer peripheral surface of the body part 222 and the upper and lower flange portions 223*a* and 223*b* may be used as a space in which a coil 50*a* to be described later is wound. Accordingly, the flange portion 223 may serve to protect the coil 50*a* from the outside and secure insulation properties between the outside and the coil 50*a* while serving to support the coil 50*a* wound around the outer peripheral surface of the body part 222 at both sides of the coil 50*a*.

The terminal fastening part 224 to which the external connection terminals 226 are fastened may be formed on one side of the upper flange portion 223*a* of the inner bobbin 220. The terminal fastening part 224 may protrude from one side of the upper flange portion 223*a* in an outward direction (i.e., an upward direction), and may include at least one lead-out groove 225 for leading out a lead wire of the coil 50*a* wound in the inner bobbin 220. The lead wire of the coil 50*a* may be led out to the outside of the inner bobbin 220 by the lead-out groove 225.

Meanwhile, the external connection terminals 226 may be fastened to the terminal fastening part 224 so as to be bent in an outer diameter direction or a downward direction of the body part 222.

In addition, the inner bobbin 220 according to the present exemplary embodiment may be coupled to and formed integrally with an outer bobbin 230 to be described later. To this end, the inner bobbin 220 may be coupled to the outer bobbin 230 while one end and the other end thereof are supported by an upper flange portion 233*a* of the outer bobbin 230 through the terminal fastening part 224 provided in the inner bobbin 220 and a wing portion 227 provided in the inner bobbin 220, respectively. This will be described in more detail in a description for an outer bobbin 230 to be provided later.

The outer bobbin 230 may have a shape similar to that of the inner bobbin 220 and have a thickness similar to that of the inner bobbin 220, but may have a size different from that of the inner bobbin 220.

The outer bobbin 230 may include a body part 232 having a through-hole 231 formed at the center of an inner portion thereof and having a tubular shape, a flange portion 233, a terminal fastening part 234, and external connection terminals 236, similar to the inner bobbin 220. Accordingly, a detailed description for the same components as those of the inner bobbin 220 will be omitted, and components different from those of the inner bobbin 220 will be described in more detail. Dummy terminals 236*a* may have a length smaller than that of the external connection terminals 236, and may serve to support the transformer 100 by coming into contact with a board 6 in a bent state.

Meanwhile, the through-hole 231 formed in the body part 232 may be used as a space into which the inner bobbin 220 is inserted and coupled. Accordingly, the through-hole 231 formed in the outer bobbin 230 may be formed in a shape corresponding to a shape of an outer peripheral edge of the flange portion 223 of the inner bobbin 220.

In addition, a space formed between an outer peripheral surface of the body part 232 of the outer bobbin 230 and one surface (i.e., an inner surface) of the flange portion 233 may be used as a space in which a coil 50*b* to be described later is wound.

Meanwhile, an insulating cap 260 for increasing a creepage distance between the external connection terminal 226 of the inner bobbin 220 and the coil 50*b* wound in the outer bobbin 230 may be inserted onto one end of the outer bobbin 230.

Specifically, the insulating cap 260 may be configured between the external connection terminal 226 of the inner bobbin 220 and the flange portion 233 of the outer bobbin 230 so that one end of the flange portion 233 of the outer bobbin 230 is inserted thereinto.

Such an insulating cap 260 may have a rectangular parallelepiped shape of which an inner space 261 is empty, may have a form in which a portion of a front surface 262 thereof is opened so that one end of the flange portion 233 of the outer bobbin 230 is inserted thereinto and an area of an upper surface 263 thereof corresponding to the terminal fastening part 224 of the inner bobbin 220 is opened. One ends of the flange portions 233*a* and 233*b* of the outer bobbin 230 may be inserted into the inner space 261 through the opened portion in the front surface 262 of the insulating cap 260, and the area of the upper surface 263 of the insulating cap 260 corresponding to the terminal fastening part 224 may be opened, such that portions of the flange portions 233*a* and 233*b* may be exposed externally.

When the insulating cap is not provided in the related art, the external connection terminal 226 of the inner bobbin 220 and the coil 50*b* wound in the outer bobbin 230 need to be spaced apart from each other by a distance of at least 6.4 mm or more (7 mm or more when a margin is included).

However, according to an exemplary embodiment of the present disclosure, the creepage distance between the external connection terminal 226 of the inner bobbin 220 and the coil 50*b* wound in the outer bobbin 230 may be close to infinity by the insulating cap 260, and thus, the external connection terminal 226 of the inner bobbin 220 and the coil 50*b* wound in the outer bobbin 230 do not need to be spaced apart from each other (extremely, a distance between the external connection terminal 226 and the coil 50*b* may be 0 mm). However, in order to install a jig for soldering, a distance L1 (see FIG. 3) between the external connection terminal 226 of the inner bobbin 220 and the coil 50*b* wound in the outer bobbin 230 may be at least 2.5 mm or more.

Since the creepage distance between the external connection terminal 226 of the inner bobbin 220 and the coil 50*b* wound in the outer bobbin 230 may be increased through the insulating cap 260 as described above, a distance according to a safety standard between the external connection terminal 226 of the inner bobbin 220 and the coil 50*b* wound in the outer bobbin 230 may be secured, such that a size and a unit cost of the bobbin part 210 may be decreased and a defect rate due to damage to the transformer occurring in a manufacturing and transporting process may be decreased.

In addition, at least one fitting projection 266*b* may be formed on each of both sides of the flange portion 233, for example, the lower flange portion 233*b*, of the outer bobbin 230 inserted into the insulating cap 260, and at least one fitting hole 266*a* into which the fitting projection 266*b* is inserted may be formed in positions on both sides of the insulating cap 260 corresponding to the fitting projection 266*b*.

In addition, at least one grip part 265 protruding outwardly may be formed on each of both sides of the insulating cap 260 in order to facilitate a grip of the insulating cap 260 and support the transformer 100 together with the dummy terminals 236*a* by coming into surface-contact with the board 6.

Meanwhile, the terminal fastening part 234 to which the external connection terminals 236 are fastened may be formed at one end of the upper flange portion 233*a*.

The terminal fastening part 234 may protrude outwardly from one end of the upper flange portion 233*a*. More specifically, the terminal fastening part 234 according to the present exemplary embodiment may be formed in a long bar shape that protrudes while extending from the upper flange portion 233*a* in an outer diameter direction and an upward direction. In this case, each of both ends of the terminal fastening part 234 formed in the bar shape may further protrude outwardly from an outer peripheral edge of the upper flange portion 233*a*.

Accordingly, as illustrated in FIG. 5, an entire width W2 of the terminal fastening part 234 may be greater than an entire width W1 of the upper flange portion 233*a* of the outer bobbin 230.

A plurality of external connection terminals 236 may be disposed at the terminal fastening part 234 according to the present exemplary embodiment so as to be spaced apart from each other by a predetermined interval. The external connection terminals 236 may be fastened to the terminal fastening part 234 in a form in which they are bent from an end of the terminal fastening part 234 in an outer diameter direction (i.e., a length direction) of the body part 232 or a downward direction.

In addition, at least one bending portion 235*a* protruding from one end of a lower surface of the lower flange portion 233*b* in the downward direction and bending a lead wire of the coil 50*b* wound around the body part 232 of the outer bobbin 230 to connect the lead wire of the coil 50*b* to the external connection terminal 236 of the outer bobbin 230 may be formed on the lower flange portion 233*b* of the outer bobbin 230.

According to such a configuration of the bending portion 235*a*, the lead wire of the coil 50*b* wound in the outer bobbin 230 may be bent at the bending portion 235*a* to be electrically connected to the external connection terminal 236.

Meanwhile, in the transformer 100 according to the present exemplary embodiment, a coil carry-forward part 270 to be described later as well as the bending portion 235*a* described above may be used in order to guide a lead wire of a secondary coil 50*b* to the external connection terminal 236.

As illustrated in FIGS. 2, 4 and 5, the transformer 100 according to the present exemplary embodiment may include the coil carry-forward part 270.

The coil carry-forward part 270 may provide a path by which the lead wire of the secondary coil 50*b* wound in the outer bobbin 230 is carried forward to an outer surface (i.e., an upper surface) of the upper flange portion 233*a* through an outer peripheral edge of the outer bobbin 230 and is connected to the external connection terminal 226.

The coil carry-forward part 270 according to the present exemplary embodiment may be formed by a guide block 239 and the terminal fastening part 234, and may include a carry-forward groove 272, a traversing path 274, and a guide groove 276.

The guide block 239 may be formed on an upper surface of the outer bobbin 230, that is, the upper surface of the upper flange portion 233*a*. The guide block 239 may be provided in order to secure a creepage distance between the external connection terminal 236 of the outer bobbin 230 and a primary coil 50*a* of the inner bobbin 220 and provide a path in which the lead wire of the coil 50*b* is disposed.

To this end, the guide block 239 according to the present exemplary embodiment may protrude from a space between the terminal fastening part 234 and the through-hole 231, and may be disposed to cross the upper surface of the upper flange portion 233*b* of the outer bobbin 230 along a direction parallel to the terminal fastening part 234 (i.e., a width direction).

In addition, the guide block 239 according to the present exemplary embodiment may be formed so that at least one of both ends thereof protrudes outwardly from the upper flange portion 233*a* of the outer bobbin 230. In this case, a space between one end of the guide block 239 protruding outwardly and one end of the terminal fastening part 234 may be used as the carry-forward groove 272.

The carry-forward groove 272 may be a groove formed by one end of the guide block 239 protruding outwardly from the outer peripheral edge of the upper flange portion 233*a* vertically (i.e., in the width direction), one end of the terminal fastening part 234, and the upper flange portion 233*a* provided between one end of the guide block 239 and one end of the terminal fastening part 234, as described above. Such a carry-forward groove 272 may be used as a path by which the lead wire of the secondary coil 50*b* wound in the outer bobbin 230 is carried forward to an upper portion of the outer bobbin 230.

The traversing path 274 may be a path formed between the guide block 239 and the terminal fastening part 234, and may provide a path traversing while crossing the upper flange portion 233*a*. The traversing path 274 may be used as a path in which the lead wire of the secondary coil 50*b* carried forward through the carry-forward groove 272 is disposed along the length direction of the terminal fastening part 234.

The guide groove 276 may be formed in a groove shape on an upper surface of the terminal fastening part 234, and may be used as a passage through which the lead wire of the secondary coil 50*b* disposed in the traversing path 274 is connected to the external connection terminal 236. That is, the guide groove 276 may change a direction of the lead wire of the secondary coil 50*b* disposed in the traversing path 274 to a direction in which the external connection terminal 236 is disposed.

To this end, the guide groove 276 may be formed to cross the terminal fastening part 234 in the width direction, such that one end of the guide groove 276 may communicate with the traversing path 274 and the other end of the guide groove 276 may be opened to the outside of the terminal fastening part 234.

A plurality of guide grooves 276 may be formed side by side according to the number of lead wires disposed in the traversing path 274 or the number of external connection terminals 236 to which the corresponding lead wires are connected.

In this case, the plurality of guide grooves 276 may be separated from each other by a plurality of partition walls 234'.

The partition walls 234' may be disposed to be spaced apart from each other at regular intervals, and the guide grooves 276 may be divided into individual grooves by the partition walls 234'. Accordingly, the lead wires disposed in the traversing path 274 may be disposed inside the guide grooves 276 while supporting the partition walls 234' (particularly edge portions).

In this case, the lead wire may be in contact with the edge portion of the partition wall 234', such that the lead wire may be excessively bent at a contact portion with the partition wall 234'. Accordingly, according to the present exemplary embodiment, the edge portion of the partition wall 234' in direct contact with the lead wire may be formed as a curved surface. It has been described by way of example in the present disclosure that the edge portion of the partition wall 234' is formed as the curved surface, but the present disclosure is not limited thereto, and may be variously applied. For example, the edge portion of the partition wall 234' may be formed as an inclined surface.

A process in which the lead wire of the secondary coil 50*b* is disposed in the coil carry-forward part 270 according to the present exemplary embodiment configured as described above and is fastened to the external connection terminal 236 will be described below.

The lead wire of the secondary coil 50*b* wound in the outer bobbin 230 may be finally fastened to the external connection terminal 236 while being wound around the external connection terminal 236. In this case, the lead wire of the secondary coil 50*b* may be fastened to the external connection terminal 236 via the above-described bending portion 235*a* or may move to the upper surface of the outer bobbin 230 through the coil carry-forward part 270 and be then connected to the external connection terminal 236.

When the lead wire is connected to the external connection terminal 236 through the coil carry-forward part 270, the lead wire may move to the upper surface of the outer bobbin 230 through the carry-forward groove 272. In addition, the lead wire may be disposed in the traversing path 274 formed on the upper surface of the outer bobbin 230, and be then connected to the external connection terminal 236 by changing its path to the guide groove 276 while supporting the partition wall 234.

In a case of the present exemplary embodiment, the path of the lead wire may be changed at an approximately right angle by the guide groove 276. However, the present disclosure is not limited thereto, and the path of the lead wire may be set by forming the partition wall 234' at various angles as long as the lead wire may be firmly fixed and fastened to the external connection terminal 236 without interference with lead wires of other coils.

In addition, the partition wall 234' according to the present exemplary embodiment may be formed so that a sidewall thereof in contact with the lead wire is approximately perpendicular to a bottom surface (i.e., the upper flange portion of the outer bobbin). This may be a configuration for preventing the lead wire supported by the partition wall 234' from being separated from the guide groove 276.

Accordingly, the partition wall 234' according to the present disclosure is not limited to the above-described configuration, and may be formed in various shapes as long as it is configured so that the lead wire supported by the guide groove 276 is not separated from the guide groove 276. For example, the sidewall of the partition wall 234' in contact with the lead wire may be formed to have an acute angle with respect to the bottom surface. In addition, various applications may be made. For example, a step or a groove may be formed on the sidewall of the partition wall 234'.

The coil carry-forward part 270 according to the present exemplary embodiment described above may be a component derived in consideration of a case of automatically and easily winding the secondary coil 50*b* in the outer bobbin 230.

That is, a process of winding the secondary coil 50*b* in the outer bobbin 230, a process of carrying the lead wire of the secondary coil 50*b* through the carry-forward groove 272 forward to the upper surface of the outer bobbin 230 and then disposing the lead wire of the secondary coil 50*b* in the traversing path 274, and a process of changing the path of the lead wire through the bending portion 235*a* to bend the lead wire in a direction in which the external connection terminal 236 is formed, and then fastening the lead wire to the external connection terminal 236, by the configuration of the coil carry-forward part 270 according to the present exemplary embodiment may be automatically performed through a separate automatic winding facility (not illustrated).

In the present disclosure, in order to prevent the lead wires of the secondary coil 50*b* from intersecting each other, the lead wires of the secondary coil 50*b* may be dispersively disposed in the bent part 235*a* of a lower surface of the lower flange portion 233*b* and the coil carry-forward part 270 of the upper flange portion 233*a* and fastened to the external connection terminals 236, and may thus be fastened to the external connection terminals 236 through more various paths than a transformer according to the related art.

In a case of the related art, when a plurality of coils are wound in the bobbin, the lead wires of the coils led to the external connection terminals may be disposed to intersect each other, and accordingly, the lead wires may be in contact with each other, such that a short circuit may occur between the coils.

However, in the transformer 100 according to the present exemplary embodiment, various paths by the coil carry-forward part 270 and the bending portion 235*a* as described above may be provided, and the lead wires may thus be connected to the external connection terminals 236 through the various paths. Accordingly, it is possible to prevent the lead wires from intersecting or being in contact with each other. Meanwhile, reference numeral 235*b*, which is not described in FIG. 4, may be a grip part protruding outwardly in order to facilitate a grip of the transformer 100.

In addition, the guide block 239 of the outer bobbin 230 according to the present exemplary embodiment may be formed to cover a portion of the through-hole 231 from an upper end of the body part 232 toward an inner portion of the through-hole 231. Accordingly, the through-hole 231 of the outer bobbin 230 may be formed to have different cross-sectional areas in a lower surface of the outer bobbin 230 and the upper surface of the outer bobbin 230.

More specifically, the cross-sectional area of the through-hole 231 in the lower surface of the outer bobbin 230 may be similar to an entire area formed by the outer peripheral edge of the flange portion 223 of the inner bobbin 220. In addition, the cross-sectional area of the through-hole 231 in the upper surface of the outer bobbin 230 may be smaller than the cross-sectional area of the lower surface described above due to the guide block 239.

In addition, the inner bobbin 220 may include the wing portion 227. The wing portion 227 may protrude from an upper surface of the upper flange portion 223*a* of the inner bobbin 220 in parallel with the guide block 239 so as to be in contact with the guide block 239, and may be formed to be spaced apart from one end of the upper flange portion 223*a* of the inner bobbin 220 by a predetermined distance, such that one end of the upper flange portion 223*a* of the inner bobbin 220 may be inserted into a lower portion of the guide block 239, and both ends of the wing portion 227 may be formed to be longer than a width of the through-hole 231 of the outer bobbin 230 by a predetermined length so as to be supported by the upper surface of the outer bobbin 230 in the width direction. Meanwhile, reference numerals 237 and 238, which are not described in FIG. 2, denote first and second protrusion parts, respectively. The first protrusion parts 237 may have one side in contact with the guide block 239, and may protrude upwardly from both sides of the upper flange portion 233*a* of the outer bobbin 230 in the width direction with respect to the through-hole 231 to support both sides of the wing portion 227. The second protrusion parts 238 may be provided at the other end of the upper flange portion 233*a* of the outer bobbin 230, and may protrude upwardly from both sides of the upper flange portion 233*a* of the outer bobbin 230 in the width direction with respect to the through-hole 231 to support both sides of the terminal fastening part 224 of the inner bobbin 220.

Meanwhile, the bobbin part 210 according to the present exemplary embodiment may be configured so that an inner surface of the flange portion 223 of the inner bobbin 220 and an inner surface of the flange portion 233 of the outer bobbin 230 are coplanar with each other. In particular, a lower surface of the upper flange portion 223*a* of the inner bobbin 220 and a lower surface of the upper flange portion 233*a* of the outer bobbin 230 may be coplanar with each other.

In addition, in the bobbin part 210 according to an exemplary embodiment of the present disclosure, the external connection terminals 226 provided in the inner bobbin 220 and the external connection terminals 236 provided in the outer bobbin 230 may be disposed to be spaced apart from each other as much as possible. Accordingly, when the inner bobbin 220 is coupled to the outer bobbin 230, a portion of the inner bobbin 220 in which the terminal fastening part 224 is formed may be coupled to the outer bobbin 230 so as to be positioned in an opposite direction to a portion of the outer bobbin 230 in which the terminal fastening part 234 is formed.

Accordingly, the external connection terminals 236 of the outer bobbin 230 and the external connection terminals 226 of the inner bobbin 220 may be disposed to protrude in opposite directions. Accordingly, in the transformer 100 according to the present exemplary embodiment, the external connection terminals 226 and 236 of the primary coil 50*a* and the secondary coil 50*b* may be sufficiently spaced apart from each other, and an insulation distance between the primary and secondary coils may thus be easily secured.

In addition, in the bobbin part 210 according to the present exemplary embodiment, when the inner bobbin 220 and the outer bobbin 230 are coupled to each other, insulation properties between the coil 50*a* wound in the inner bobbin 220 and the coil 50*b* wound in the outer bobbin 230 may be secured through the outer bobbin 230. Accordingly, the bobbin part 210 may have higher insulation properties than the related art in which an insulating tape is used, and the coil 50*a* wound in the inner bobbin 220 and the coil 50*b* wound in the outer bobbin 230 may thus be disposed as adjacent to each other as possible.

However, an outer surface of the primary coil 50*a* and an inner peripheral surface of the through-hole 231 of the outer bobbin 230 may also be configured to be spaced apart from each other by a predetermined interval in order to secure output characteristics or a creepage distance of the transformer 100. This may be easily applied by adjusting a width of the flange portion 223 of the inner bobbin 220 or turns of the primary coil 50*a* wound in the inner bobbin.

Each of the individual bobbins 220 and 220 of the bobbin part 210 according to the present exemplary embodiment configured as described above may be easily manufactured by injection molding, but is not limited thereto, and may also be manufactured by various methods such as press working. In addition, the individual bobbins 220 and 230 of the bobbin part 210 according to the present exemplary embodiment may be formed of an insulating resin material, and may be formed of a material having high heat resistance and high voltage resistance. As a material of the bobbins 220 and 230, polyphenylenesulfide (PPS), liquid crystal polyester (LCP), polybutyleneterephthalate (PBT), polyethyleneterephthalate (PET), phenolic resin, or the like, may be used.

The coil 50 may include the primary coil 50*a* and the secondary coil 50*b*.

The primary coil 50*a* may be wound in the inner bobbin 220.

In addition, the primary coil 50*a* according to the present disclosure may include a plurality of coils wound in one inner bobbin 220 and electrically insulated from each other. That is, in the transformer 100 according to the present exemplary embodiment, the plurality of coils may constitute the primary coil 50*a*, such that voltages may be selectively applied to the respective coils and various voltages may be drawn out through the secondary coil 50*b* correspondingly.

In this case, the number of external connection terminals 226 provided in the inner bobbin 220 may be increased to two or more.

As the plurality of coils constituting the primary coil 50*a*, coils having different diameters may be selectively used, and may be configured to have different turns amounts. In addition, as the primary coil 50*a*, a solid wire may be used or a stranded wire formed by twisting several strands may be used.

A lead wire of such a primary coil 50*a* may be connected to the external connection terminal 226 included in the inner bobbin 220.

The secondary coil 50*b* may be wound in the outer bobbin 230.

Similar to the above-mentioned primary coil 50*a*, the secondary coil 50*b* may also include a plurality of coils wound in the outer bobbin 230 and electrically insulated from each other. In addition, a lead wire of the secondary coil 50*b* may be connected to the external connection terminal 236 included in the outer bobbin 230.

Meanwhile, in the present exemplary embodiment, as described above, a case where the primary coil 50*a* is wound in the inner bobbin 220 and the secondary coil 50*b* is wound in the outer bobbin 230 has been described by way of example. However, the present disclosure is not limited thereto, and may be variously applied as long as a user may draw out a desired voltage. For example, the primary coil 50*a* may be wound in the outer bobbin 230 and the secondary coil 50*b* may be wound in the inner bobbin 220.

The cores 40 may be inserted into the through-hole 221 formed in the inner bobbin 220. The cores 40 according to the present exemplary embodiment may be configured in pair, and the pair of cores 40 may be inserted into the through-hole 221 of the inner bobbin 220 to be fastened to each other while being in contact with each other. As such cores 40, 'EE' cores, 'EI' cores, or the like, may be used.

As the cores 40 are coupled to the bobbin part 210, the cores 40 may support lower surfaces of the inner bobbin 220 and the outer bobbin 230. Accordingly, the inner bobbin 220 and the outer bobbin 230 may be not separated from each other by the cores 40.

The core 40 may be formed of Mn—Zn based ferrite having higher permeability, lower loss, a higher saturation magnetic flux density, higher stability, and a lower production cost, than other materials. However, in an exemplary embodiment of the present disclosure, a shape or a material of the core 40 is not limited.

Meanwhile, insulating tapes 40*b* may be interposed between the bobbin part 210 and the cores 40 according to the present exemplary embodiment. The insulating tapes between the bobbin part 210 and the cores 40 may be used in order to secure insulation between the coil 50 wound in the bobbin part 210 and the cores 40.

Such an insulating tape 40*b* may be interposed so as to correspond to an entire inner peripheral surface of the core 40 facing the bobbin part 210 or my only be partially interposed at a portion at which the coil 50 and the core 40 face each other. In addition, an insulating tape 40*a* may be attached to an outer surface of the core 40.

The transformer 100 according to the present exemplary embodiment may be seated on the board 6 while the external connection terminals 226 and 236 are inserted into fastening holes 6*a* formed in the board 6, for example, a printed circuit board.

Accordingly, the board 6 according to the present exemplary embodiment may include an accommodation part 6*b* having a through-hole shape corresponding to a shape of the transformer 100. As illustrated in FIG. 2, when the accommodation part 6*b* is formed in the board 6, the transformer 100 may be mounted on the board 6 in a state in which it is accommodated in the accommodation part 6*b*, and may protrude from a lower portion of the board 6 by a predetermined length.

Specifically, upper surfaces of the lower flange portions 223*b* and 233*b* of the flange portions 223 and 233 of the transformer 100 may be coplanar with an upper surface of the board 6. Alternatively, upper surfaces of the lower flange portions 223*b* and 233*b* of the flange portions 223 and 233 of the transformer 100 may be disposed on a level below an upper surface of the board 6, and the external connection terminals 226 and 236 bent in the downward direction may be fastened to one ends of the upper flange portions 223*a* and 233*a* of the flange portions 223 and 233, respectively.

In this case, as illustrated in FIG. 3, a distance L2 from the upper flange portions 223*a* and 233*a* to which the external connection terminals 226 and 236 are fastened, respectively, to the upper surface of the board 6 may be 9 mm to 10 mm. On the other hand, when the external connection terminals are fastened to the lower flange portions, a distance from the lower flange portions to which the external connection terminals are fastened to the upper surface of the board may be 3.9 mm.

As such, the transformer 100 may be partially accommodated in the board 6, and a maximum mounting height of electronic components mounted on the board 6 may thus be significantly decreased.

As described above, in the transformer 100 according to the present exemplary embodiment, when the inner bobbin 220 is couple to the outer bobbin 230, the inner bobbin 220 may be coupled to the outer bobbin 230 while one end and the other end thereof are supported by an upper flange portion 233*a* of the outer bobbin 230 through the terminal fastening part 224 provided in the inner bobbin 220 and the wing portion 227 provided in the inner bobbin 220, respectively.

In this case, one end of the upper flange portion 223*a* of the inner bobbin 220 may be inserted into the lower portion of the guide block 239.

Accordingly, in the transformer 100 according to the present exemplary embodiment, the inner bobbin 220 and the outer bobbin 230 may be very easily assembled and coupled to each other, and after the inner bobbin 220 and the outer bobbin 230 are coupled to each other, the inner bobbin 220 may not be easily separated or protruded from the outer bobbin 230.

Figure 6:
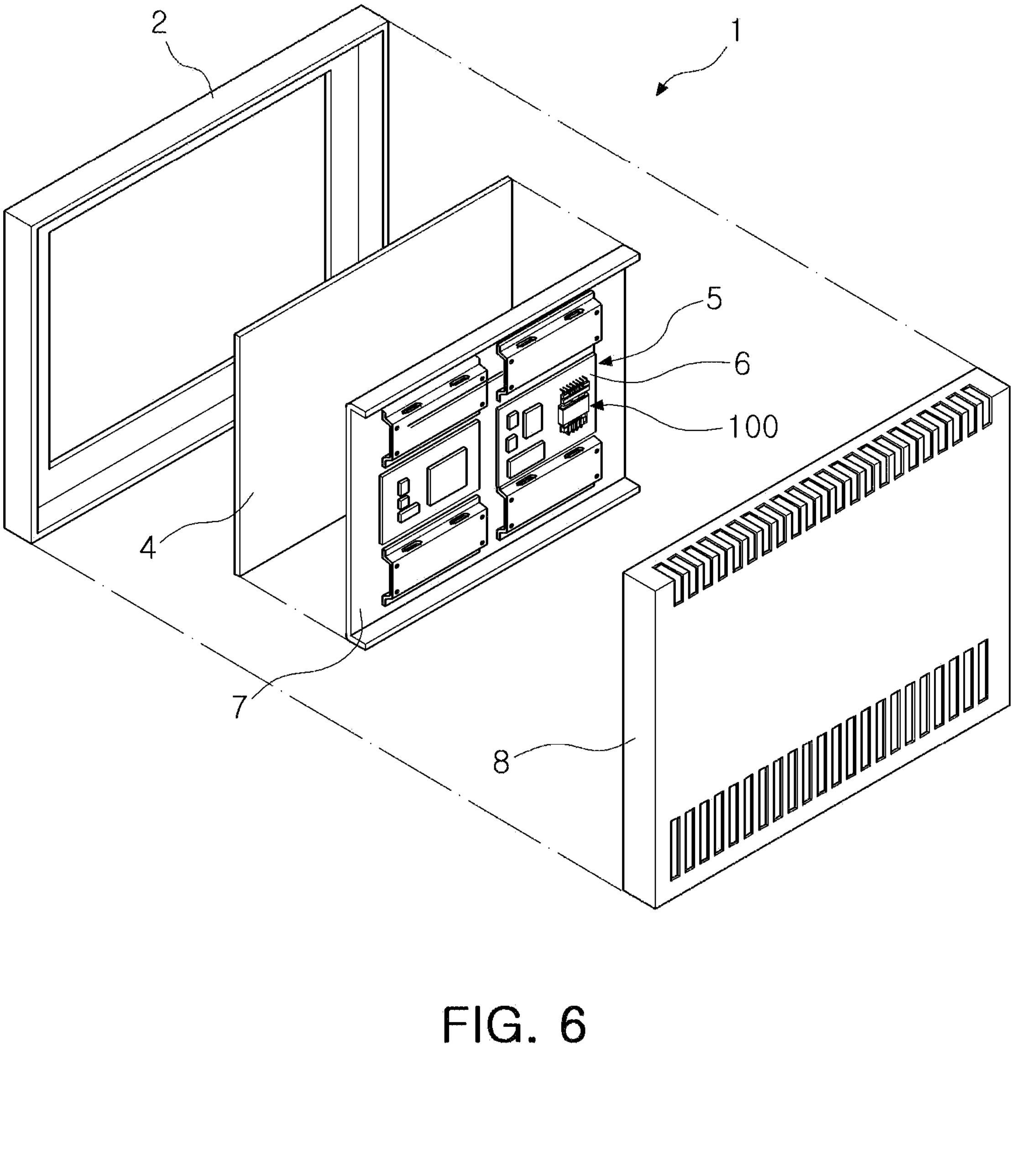
FIG. 6 is a schematic exploded perspective view illustrating a flat panel display device according to an exemplary embodiment of the present disclosure.

FIG. 6 is a schematic exploded perspective view illustrating a flat panel display device according to an exemplary embodiment of the present disclosure.

Referring to FIG. 6, a flat panel display device 1 according to an exemplary embodiment of the present disclosure may include a display panel 4, a power supply 5 in which the transformer 100 is mounted, and covers 2 and 8.

The covers 2 and 8 may include a front cover 2 and aback cover 8, and may be coupled to each other to form an inner space.

The display panel 4 may be disposed in the inner space formed by the covers 2 and 8, and various flat panel display panels such as a liquid crystal display (LCD), a plasma display panel (PDP), and an organic light emitting diode (OLED) may be used as the display panel 4.

The power supply (for example, a switching mode power supply (SMPS)) 5 may provide power to the display panel 4. The power supply 5 may be formed by mounting a plurality of electronic components on a printed circuit board 6 and may be mounted particularly with the transformer 100 according to the exemplary embodiments described above. The power supply 5 may be assembled to a rear surface of the display panel 4 described above in parallel with the rear surface of the display panel 4, such that an entire thickness of a product may be decreased.

The power supply 5 may be fixed to a chassis 7 and be disposed and fixed in the inner space formed by the covers 2 and 8 together with the display panel 4.

In this case, in the transformer 100 mounted in the power supply 5, the coil 50 may be wound in a direction parallel to the printed circuit board 6.

The transformer disclosed in the present exemplary embodiments described above is configured to be appropriated for an automated manufacturing method.

That is, in the transformer according to the present exemplary embodiment, the coils may be wound separately in the inner bobbin and the outer bobbin, and when the winding of the coils is completed, the inner bobbin and the outer bobbin may be coupled to each other, and the cores may be then coupled to the bobbin part to complete the transformer.

As such, the transformer according to the present disclosure may be configured so that the coils may be wound in a state in which the inner bobbin and the outer bobbin are separated from each other so that the primary coil and the secondary coil may be automatically and easily wound. In this case, the coils may be wound through a separate automatic winding facility.

As set forth above, most of processes of manufacturing the transformer according to the present exemplary embodiment may be automated, and accordingly, a cost and a time required for manufacturing the transformer may be significantly decreased.

In addition, according to an exemplary embodiment of the present disclosure, the inner bobbin and the outer bobbin may include, respectively, the external connection terminals fastened to one ends of the upper flange portions formed at upper ends of the body parts and bent in the downward direction to increase turns of the coil while meeting a defined height standard of the transformer.

Further, according to an exemplary embodiment of the present disclosure, the transformer may include the insulating cap into which one end of the flange portion of the outer bobbin is inserted, such that a distance according to a safety standard between the external connection terminal of the inner bobbin and the coil wound in the outer bobbin may be secured through an increase in creepage distance. Therefore, a size and a unit cost of the bobbin may be decreased, and a defect rate due to damage to the transformer occurring in a manufacturing and transporting process may be decreased.

Further, according to an exemplary embodiment of the present disclosure, the outer bobbin may include the coil carry-forward part carrying the lead wire of the coil forward to the upper surface of the flange portion of the outer bobbin through the outer peripheral edge of the flange portion of the outer bobbin to connect the lead wire of the coil to the external connection terminal and the bending portion bending the lead wire of the coil wound around the body part of the outer bobbin to connect the lead wire of the coil to the external connection terminal of the outer bobbin. As such, the lead wires of the coils may be connected to the external connection terminals through various paths, and thus, a problem in which a short-circuit may occur due to contact between the lead wires may be prevented.

Further, according to an exemplary embodiment of the present disclosure, when the inner bobbin and the outer bobbin of the transformer are coupled to each other, the inner bobbin and the outer bobbin may be coupled to each other in a form in which the inner bobbin is accommodated in the outer bobbin. Accordingly, the transformer may be maintained to have a flat, thin shape as a whole, and may thus be easily adopted in a thin display device or the like.

Further, according to an exemplary embodiment of the present disclosure, the transformer may include a plurality of bobbins (e.g., the inner bobbin and the outer bobbin) that are individually separated and have a structure in which these bobbins are coupled to each other. Accordingly, the transform may be completed by winding the coils in each of the individual bobbins and then coupling the individual bobbins in which the coils are wound to each other. Accordingly, a production process of the transformer may be automated, and accordingly, a cost and a time required for manufacturing the transformer may be significantly decreased.

A case where each of the individual bobbins is formed in an approximately rectangular parallelepiped shape has been described by way of example in the exemplary embodiments described above. However, the present disclosure is not limited thereto, and each of the individual bobbins may be formed in various shapes such as a cylindrical shape as long as a desired voltage may be drawn out.

In addition, the transformer used in the display device has been described by way of example in the present exemplary embodiment, but the present disclosure is not limited thereto, and may be widely applied to any thin electronic device including the transformer While exemplary embodiments have been shown and described above, it will be apparent to those skilled in the art that modifications and variations could be made without departing from the scope of the present invention as defined by the appended claims.

What is claimed is:

1. A transformer comprising:
- a bobbin part including an inner bobbin and an outer bobbin including, respectively, body parts having through-holes formed therein and having a tubular shape and flange portions protruding outwardly from both ends of the body parts;
- coils respectively wound in the inner bobbin and the outer bobbin; and
- a core electrically coupled to the coils to form a magnetic circuit,
- wherein the inner bobbin and the outer bobbin include, respectively, external connection terminals fastened to one ends of the flange portions (hereinafter, referred to as upper flange portions) formed at an upper end of the body part and bent in a downward direction.

2. The transformer of claim 1, wherein the inner bobbin and the outer bobbin are coupled to each other so that the external connection terminal of the inner bobbin and the external connection terminal of the outer bobbin are disposed in opposite directions.

3. The transformer of claim 2, wherein the outer bobbin and the inner bobbin further include, respectively, terminal fastening parts protruding outwardly from one ends of the upper flange portions and to which the external connection terminals are fastened.

4. The transformer of claim 3, wherein the inner bobbin is coupled to the outer bobbin while one end and the other end thereof are supported by the upper flange portion of the outer bobbin through the terminal fastening part provided in the inner bobbin and a wing portion provided in the inner bobbin, respectively.

5. The transformer of claim 4, wherein the outer bobbin includes a guide block protruding from an upper surface of the upper flange portion of the outer bobbin in parallel with the terminal fastening part of the outer bobbin and covering a portion of the through-hole of the outer bobbin, and
- the wing portion protrudes from an upper surface of the upper flange portion of the inner bobbin in parallel with the guide block so as to be in contact with the guide block, and is formed to be spaced apart from one end of the upper flange portion of the inner bobbin by a predetermined distance, such that one end of the upper flange portion of the inner bobbin is inserted into a lower portion of the guide block, and both ends of the wing portion are formed to be longer than a width of the through-hole of the outer bobbin by a predetermined length so as to be supported by an upper surface of the outer bobbin in a width direction.

6. The transformer of claim 1, further comprising an insulating cap increasing a creepage distance between the external connection terminal of the inner bobbin and the coil wound in the outer bobbin.

7. The transformer of claim 6, wherein the insulating cap is configured between the external connection terminal of the inner bobbin and the flange portion of the outer bobbin so that one end of the flange portion of the outer bobbin is inserted thereinto.

8. The transformer of claim 7, wherein the insulating cap has a rectangular parallelepiped shape of which an inner space is empty, one end of the flange portion of the outer bobbin is inserted into the inner space through an opened portion of a front surface of the insulating cap, and an area of an upper surface of the insulating cap corresponding to the terminal fastening part is opened, such that a portion of the flange portion is exposed externally.

9. The transformer of claim 7, wherein at least one fitting projection is formed on each of both sides of the flange portion of the outer bobbin inserted into the insulating cap, and at least one fitting hole into which the fitting projection is inserted is formed in positions on both sides of the insulating cap corresponding to the fitting projection.

10. The transformer of claim 7, wherein at least one grip part protruding outwardly in order to facilitate a grip of the insulating cap is formed on each of both sides of the insulating cap.

11. The transformer of claim 1, wherein an inner surface of the flange portion of the inner bobbin and an inner surface of the flange portion of the outer bobbin are coplanar with each other.

12. The transformer of claim 11, wherein the outer bobbin further includes a bending portion protruding downwardly from one end of a flange portion (hereinafter, referred to as a 'lower flange portion') formed at a lower end of the body part of the outer bobbin and bending a lead wire of the coil wound around the body part of the outer bobbin to connect the lead wire of the coil to the external connection terminal of the outer bobbin.

13. The transformer of claim 1, wherein the outer bobbin includes a coil carry-forward part that is a path by which a lead wire of the coil wound around the body part of the outer bobbin is carried forward to an upper surface of the flange portion of the outer bobbin through an outer peripheral edge of the flange portion of the outer bobbin and is connected to the external connection terminal of the outer bobbin.

14. The transformer of claim 13, wherein the coil carry-forward part includes:

a carry-forward groove that is a path in which a lead wire of the coil wound around the body part of the outer bobbin is carried forward to an upper surface of the flange portion of the outer bobbin; and a traversing path that is a path disposed so that the lead wire carried forward through the carry-forward groove traverses the upper surface of the flange portion of the outer bobbin.

15. The transformer of claim 13, wherein the outer bobbin includes a terminal fastening part protruding outwardly from one end of the upper flange portion of the outer bobbin and to which the external connection terminal is fastened, and the coil carry-forward part is a path formed between the terminal fastening part of the outer bobbin and a guide block protruding from an upper surface of the upper flange portion of the outer bobbin in parallel with the terminal fastening part of the outer bobbin.

16. The transformer of claim 15, wherein the guide block has one end protruding outwardly from an outer peripheral edge of the upper flange portion of the outer bobbin, and the carry-forward groove is a groove formed by the protruding one end of the guide block, the terminal fastening part of the outer bobbin, and the upper flange portion of the outer bobbin.

17. A power supply comprising:

a board in which an accommodation part is formed; and a transformer mounted in the accommodation part formed in the board and including a bobbin part including a body part having a through-hole formed therein and having a tubular shape and flange portions protruding outwardly from both ends of the body part, wherein an upper surface of a lower flange portion of the flange portion is coplanar with an upper surface of the board or is positioned on a level below the upper surface of the board.

18. The power supply of claim 17, wherein an external connection terminal bent in a downward direction is fastened to one end of an upper flange portion of the flange portion.

19. A flat panel display device comprising:

the power supply of claim 17;

a display panel receiving power from the power supply; and a cover protecting the display panel and the power supply, wherein the power supply is connected to one surface of the display panel in parallel with one surface of the display panel.

* * * * *